(12) United States Patent
Hongoh

(10) Patent No.: US 6,325,018 B1
(45) Date of Patent: Dec. 4, 2001

(54) FLAT ANTENNA HAVING OPENINGS PROVIDED WITH CONDUCTIVE MATERIALS ACCOMMODATED THEREIN AND PLASMA PROCESSING APPARATUS USING THE FLAT ANTENNA

(75) Inventor: Toshiaki Hongoh, Nakakoma-Gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/521,649

(22) Filed: Mar. 8, 2000

(30) Foreign Application Priority Data

Mar. 12, 1999 (JP) .................................. 11-067477

(51) Int. Cl.[7] ............................. C23C 16/00; H05H 1/00
(52) U.S. Cl. .................... 118/723 AN; 118/723 MW; 156/345
(58) Field of Search ..................... 118/723 AN, 723 MW, 118/723 ME, 723 MR, 723 MA; 156/345

(56) References Cited

U.S. PATENT DOCUMENTS

| 4,985,109 | * | 1/1991 | Otsubo et al. | 156/345 |
| 5,074,985 | * | 12/1991 | Tamura et al. | 204/298.11 |
| 5,134,965 | * | 8/1992 | Tokuda et al. | 118/723 MW |
| 5,698,036 | | 12/1997 | Ishii et al. | 118/723 |
| 6,158,383 | * | 12/2000 | Watanabe et al. | 118/723 AN |

FOREIGN PATENT DOCUMENTS

| 5-343334 | | 12/1993 | (JP) . | |
| 8-203881 | * | 8/1996 | (JP) | C23C/16/50 |
| 9-181052 | | 7/1997 | (JP) . | |
| 10-12594 | * | 1/1998 | (JP) | C23C/16/50 |
| 10-177994 | * | 6/1998 | (JP) | C23C/16/50 |

OTHER PUBLICATIONS

Matsuzawa et al., Circularly Polarized Slot Antenna Fed by Coplanar Waveguide, Electronic Information Communication Society, B-11, vol. J80-B-II, No. 10, Oct. 1997, pp. 871–878.

* cited by examiner

Primary Examiner—Gregory Mills
Assistant Examiner—P. Hassanzadeh
(74) Attorney, Agent, or Firm—Pillsbury Winthrop LLP

(57) ABSTRACT

A flat antenna radiates a microwave toward a process chamber so as to generate a plasma within the process chamber. The flat antenna has a front surface to which the microwave is supplied and a back surface opposite to the front surface. The microwave is supplied to a center portion of the front surface and propagates in radial directions within the flat antenna. A plurality of openings extend between the front surface and the back surface of the flat antenna. A conductive member is located in each of the openings so that a circularly polarized microwave is radiated by each of the openings.

19 Claims, 10 Drawing Sheets

CENTER 0 OF ANTENNA MEMBER

FLAT ANTENNA HAVING OPENINGS PROVIDED WITH CONDUCTIVE MATERIALS ACCOMMODATED THEREIN AND PLASMA PROCESSING APPARATUS USING THE FLAT ANTENNA

BACKGROUND OF THE INVENTION

1. Field of the Invention

The present invention generally relates to plasma processing apparatuses and, more particularly, to a plasma processing apparatus which processes a wafer for producing a semiconductor device by using a plasma generated by a microwave.

2. Description of the Related Art

Recently, in a semiconductor device manufacturing process, plasma processing apparatuses have been used to perform semiconductor producing processes such as a deposition process, an etching process or an ashing or stripping process since high-density integration and fine structure are required for semiconductor devices. Particularly, a microwave plasma processing apparatus has become popular since the microwave plasma processing apparatus is capable of generating stable plasma at a relatively low vacuum of 0.1 millitorr (mTorr) to several tens of mTorr. The microwave plasma processing apparatus generates high-density plasma by using a microwave or a combination of a microwave and a magnetic field generated by a ring-like coil. The above-mentioned plasma processing apparatus is disclosed in Japanese Laid-Open Patents No. 5-343334 and No. 9-181052.

A description will now be given, with reference to FIGS. 1 and 2, of a conventional microwave plasma processing apparatus. FIG. 1 is a schematic cross-sectional view of a conventional microwave plasma processing apparatus. FIG. 2 is a plan view of an antenna member provided in the microwave plasma processing apparatus.

In FIG. 1, the conventional microwave plasma processing apparatus 2 comprises: a process chamber 4; a table 6 provided inside the process chamber 4; an insulating plate 8 defining a top plate of the process chamber 4 and positioned above the table 6; and an antenna member 10 positioned above the insulating plate 8. The process chamber 4 is constructed so that air inside the process chamber 4 can be evacuated to generate a vacuum therein. The insulating plate 8 is formed of a material that can transmit a microwave.

The antenna member 10 has a flat, disk-like shape as shown in FIG. 2, and has a thickness of several millimeters. Above the antenna member 10 is a slow-wave member 16 formed of a dielectric material so as to reduce the wavelength of a microwave in radial directions of the antenna member 10. The antenna member 10 is provided with many slots 14 each of which has an elongated rectangular shape when viewed from a direction perpendicular to the flat surface of the antenna member 10. Generally, the slots 14 are arranged along concentric circles as shown in FIG. 2, or arranged along a spiral.

The plasma processing apparatus 2 has a coaxial waveguide 12 connected to a center portion of the antenna member 10 so as to introduce a microwave generated by a microwave generator (not shown in the figure) into the antenna member 10. The microwave introduced into the center portion of the antenna member 10 propagates through the antenna member 10 in radial directions thereof, and is directed downwardly toward the interior of the process chamber 4. The microwave introduced into the process chamber 4 generates plasma so that a wafer W placed on the table 6 in the process chamber 4 is subjected to predetermined plasma processing such as plasma etching or deposition.

FIG. 3 is an enlarged plan view of the slot 14 formed in the antenna member 10. As shown in FIG. 3, each of the slots 14 has a rectangular shape having a width L1 of between 10 and 20 millimeters and a length L2 of about several tens of millimeters. The inner walls of the slot 14 are perpendicular to the flat surfaces of the antenna member 10.

The coaxial waveguide 12 is connected to the center portion of the antenna member 10 so as to introduce a microwave generated by a microwave generator (not shown in the figure). The microwave introduced into the antenna member 10 propagates through the antenna member 10 in radial directions and is directed downward toward the process chamber 4 by the slots 14 provided in the antenna member 10. The microwave introduced into the process chamber 4 generates plasma so that a wafer W placed on the table 6 in the process chamber 4 is subjected to predetermined plasma processing such as plasma etching or deposition. In this case, the microwave directed downward toward the process chamber 4 by the slots 14 is a linearly polarized wave.

It is known that a microwave causes concentration of an electric field near a sharp angle portion when the microwave propagates in a solid medium. Thus, when the linearly polarized microwave reaches the surface of the wafer W in the process chamber 4, a concentration of an electric field occurs along the contour of the wafer W which increases the density of plasma. This results in unevenness of the plasma density over the entire surface of the wafer W. Particularly, such a problem becomes more serious as the diameter of the wafer is increased from 6 inches to 8 or 12 inches since the magnitude of unevenness of the plasma processing is increased.

Accordingly, there is a case in which the input power supplied to the plasma processing apparatus is limited so that an abnormal discharge does not occur due to the unevenness of the electric field. However, in such a case, there is a problem in that the throughput of the plasma processing is greatly decreased.

"Circularly Polarized Slot Antenna Fed by Coplaner Waveguide", technical paper of the Electronic Information Communication Society, B-11, vol. J80-B-II, No.10, October 1997, pp.871–878 suggests an antenna structure not for the generation of plasma but for communication use. The structure of the antenna suggested in this technical paper has a plurality of slots each having a loop-like form so as to generate a circularly polarized wave by the slots. Each of the slots is formed by a square opening provided with a metal member therein. A slot line path is arranged along one of the outer sides so as to transmit the microwave. However, the antenna was developed for the communication use, and the antenna used for the plasma processing apparatus related to the present invention does not require such a waveguide line path.

SUMMARY OF THE INVENTION

It is a general object of the present invention to provide an improved and useful flat antenna used for a plasma processing apparatus in which the above-mentioned problems are eliminated.

A more specific object of the present invention is to provide a flat antenna, which can prevent an occurrence of an abnormal discharge due to a concentration of an electric field.

Another object of the present invention is to provide a flat antenna which can generate a circularly polarized microwave by openings formed therein so as to generate an evenly distributed plasma in a process chamber.

In order to achieve the above-mentioned objects, there is provided according to one aspect of the present invention a flat antenna adapted to be used for introducing a microwave into a process chamber so as to generate a plasma within the process chamber, the flat antenna comprising: a front surface to which the microwave is supplied and a back surface opposite to the front surface, the microwave being supplied to a center portion of the front surface and propagating in radial directions within the flat antenna; a plurality of openings extending between the front surface and the back surface of the flat antenna; and a conductive member located in each of the openings so that a circularly polarized microwave is radiated by each of the openings.

According to the present invention, the circularly polarized microwave is radiated from each of the openings provided in the flat antenna. Thus, a local concentration of an electric field along a periphery of the material to be processed placed in the process chamber is prevented. This prevents generation of an abnormal discharge due to the local concentration of the electric field, and improves evenness in the density of the plasma generated in the process chamber.

In one embodiment of the present invention, a length of a contour of each of the openings may be set to a length between 0.5 times the wavelength of the microwave and 2.5 times the wavelength of the microwave.

Additionally, each of the openings may have a square shape, and a diagonal line of each of the openings may extend in a radial direction of the flat antenna.

In one embodiment of the present invention, each of the openings may have an elongated elliptic shape. Alternatively, each of the openings may have a polygonal shape with rounded corners.

Additionally, the openings may be arranged along a plurality of concentric circles or a spiral so that the openings are evenly distributed over the entire flat antenna.

Additionally, there is provided according to another aspect of the present invention a flat antenna adapted to be used for introducing a microwave into a process chamber so as to generate a plasma within the process chamber, the flat antenna comprising: a first conductive member having a plurality of openings extending between a front surface and a back surface opposite to the front surface; and a second conductive member situated in each of the openings provided in the first conductive member.

According to the present invention, the circularly polarized microwave is radiated from each of the openings provided with the second conductive member therein. Thus, a local concentration of an electric field along a periphery of the material to be processed placed in the process chamber is prevented. This prevents generation of an abnormal discharge due to the local concentration of the electric field, and improves evenness in the density of the plasma generated in the process chamber.

The flat antenna according to the present invention is applied to a plasma processing apparatus so that uniform plasma is generated in the plasma processing apparatus.

Other objects, features and advantages of the present invention will become more apparent from the following detailed description when read in conjunction with the accompanying drawings.

DETAILED DESCRIPTION OF THE PREFERRED EMBODIMENTS

Figure 1:
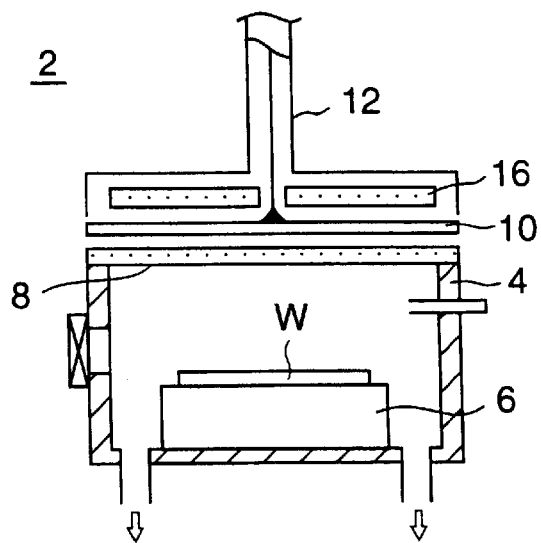
FIG. 1 is a schematic cross-sectional view of a conventional microwave plasma processing apparatus.
Figure 2:
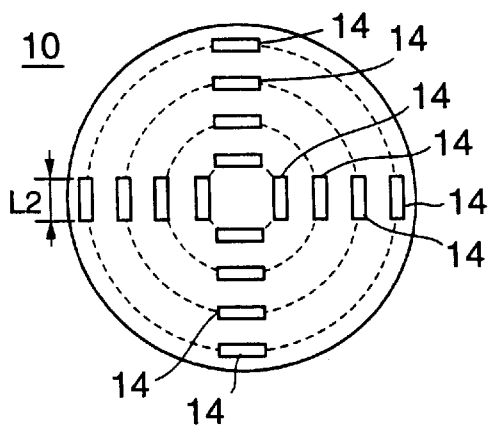
FIG. 2 is a plan view of an antenna member provided in the microwave plasma processing apparatus shown in FIG. 1.
Figure 3:
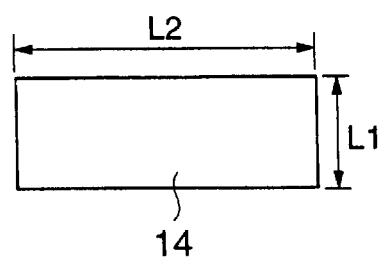
FIG. 3 is an plan view of a slot formed in the antenna member shown in FIG. 2.
Figure 4:
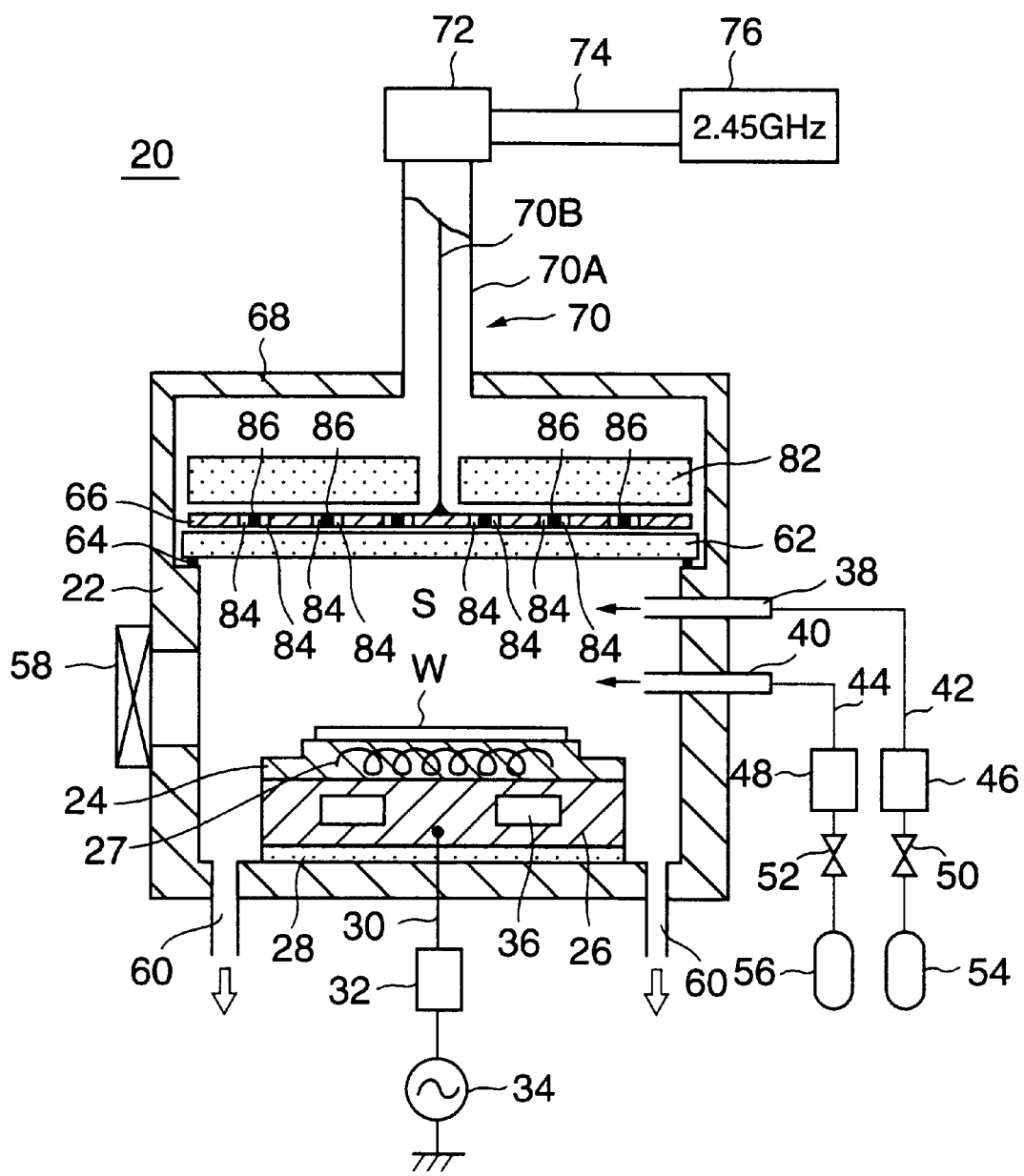
FIG. 4 is a cross-sectional view of a plasma processing apparatus having a flat antenna according to a first embodiment of the present invention.

A description will now be given, with reference to FIG. 4, of a first embodiment of the present invention. FIG. 4 is a cross-sectional view of a plasma processing apparatus having a flat antenna according to the first embodiment of the present invention.

The plasma processing apparatus 20 shown in FIG. 4 performs a plasma chemical vapor deposition (plasma CVD) process. The plasma processing apparatus 20 comprises a process chamber 22 having a cylindrical shape so as to form a sealed space S. A side wall and a bottom wall of the process chamber 22 are made of a conductive material such as aluminum.

A table 24 is situated within the process chamber 22 so that material to be processed such as a wafer W is placed thereon. The table 24 is made of an anodized aluminum alloy, and has a generally cylindrical shape having a raised, flat top surface. The table 24 is supported by a support table 26, which is made of an aluminum alloy and has a cylindrical shape. The support table 26 is fixed to a bottom of the process chamber 22 via an insulating member 28.

An electrostatic chuck or a clamping mechanism (not shown in the figure) is provided to the table 24 so as to retain the wafer W on the top surface of the table 24. A heater 27 is provided in the table 24 so as to heat the wafer W placed on the table 24. The table 24 is electrically connected to a high-frequency power supply 34 of 13.56 MHz by a power supply line 30 via a matching box 32 so as to supply a bias voltage to the table 24. The high-frequency power supply 34 is not necessarily connected to the table 24 if the bias voltage is not needed.

The support table 26 supporting the table 24 is provided with a cooling jacket 36 through which cooling water flows so as to cool the wafer W during the plasma processing. It should be noted that a heater for heating the wafer 24 may be provided in the table 24 if it is necessary.

Nozzles 38 and 40 are provided on the side wall of the process chamber 22 so as to introduce various gasses into the process chamber 22. The nozzle 38 is a tubular member made from quartz so as to supply to the process chamber 22 a gas for generating plasma such as argon gas. The nozzle 38 is connected to a plasma gas supply source 54 by a supply line 42 via a mass flow controller 46 and a stop valve 50. The nozzle 40 is a tubular member made from quartz so as to supply a process gas such as a deposition gas to the process chamber 22. The nozzle 40 is connected to a process gas supply source 56 by a supply line 44 via a mass flow controller 48 and a stop valve 52. As for the process gas, $SiH_4$, $O_2$ or $N_2$ gas may be used.

A gate valve 58 is provided on the side wall of the process chamber 22. The gate valve 58 is opened when the wafer W is put inside the process chamber 22 and removed from the process chamber 22. Vacuum ports 60 are provided on the bottom of the process chamber 22. The vacuum ports 60 are connected to a vacuum pump (not shown in the figure) so as to evacuate air from the process chamber 22.

The top of the process chamber 22 is hermetically closed by an insulating plate 62 having a thickness of about 20 nm. A sealing member 64 such as an O-ring is provided between the insulating plate 62 and a top surface of the side wall of the process chamber 22. The insulating plate 62 is made of an insulating material such as $SiO_2$ or ceramics such as aluminum nitride (AlN) which has a high transmissivity with respect to a microwave.

A flat antenna 66 is provided on the top surface of the insulating plate 62. The flat antenna 66 serves as a bottom of a waveguide box 68 which has a cylindrical shape and integrally formed with the process chamber 22. The flat antenna 66 faces the top surface of the table 24 with the insulating plate 62 therebetween.

The outer tube 70A of a coaxial waveguide 70 is connected to the center of the top portion of the waveguide box 68. An inner cable 70B is connected to the center portion of the flat antenna 66. The waveguide 70 is connected to a microwave generator 76, which generates a 2.45 GHz microwave, via a mode converter 72 so that the microwave generated by the microwave generator 76 is transmitted to the flat antenna 66. The frequency of the microwave is not limited to 2.45 GHz, and, for example, a microwave of 8.35 GHz may be used. As for the waveguide 70, a waveguide having a circular cross section or a square cross section or a coaxial waveguide may be used. In the present embodiment, the waveguide 70 is a coaxial waveguide. Additionally, a slow-wave member 82 having a predetermined thickness is provided on the top surface of the flat antenna 66 within the waveguide box 68. The slow-wave member 82 is provided, if necessary, so as to shorten the wavelength of the microwave according to its wavelength shortening effect.

Figure 5:
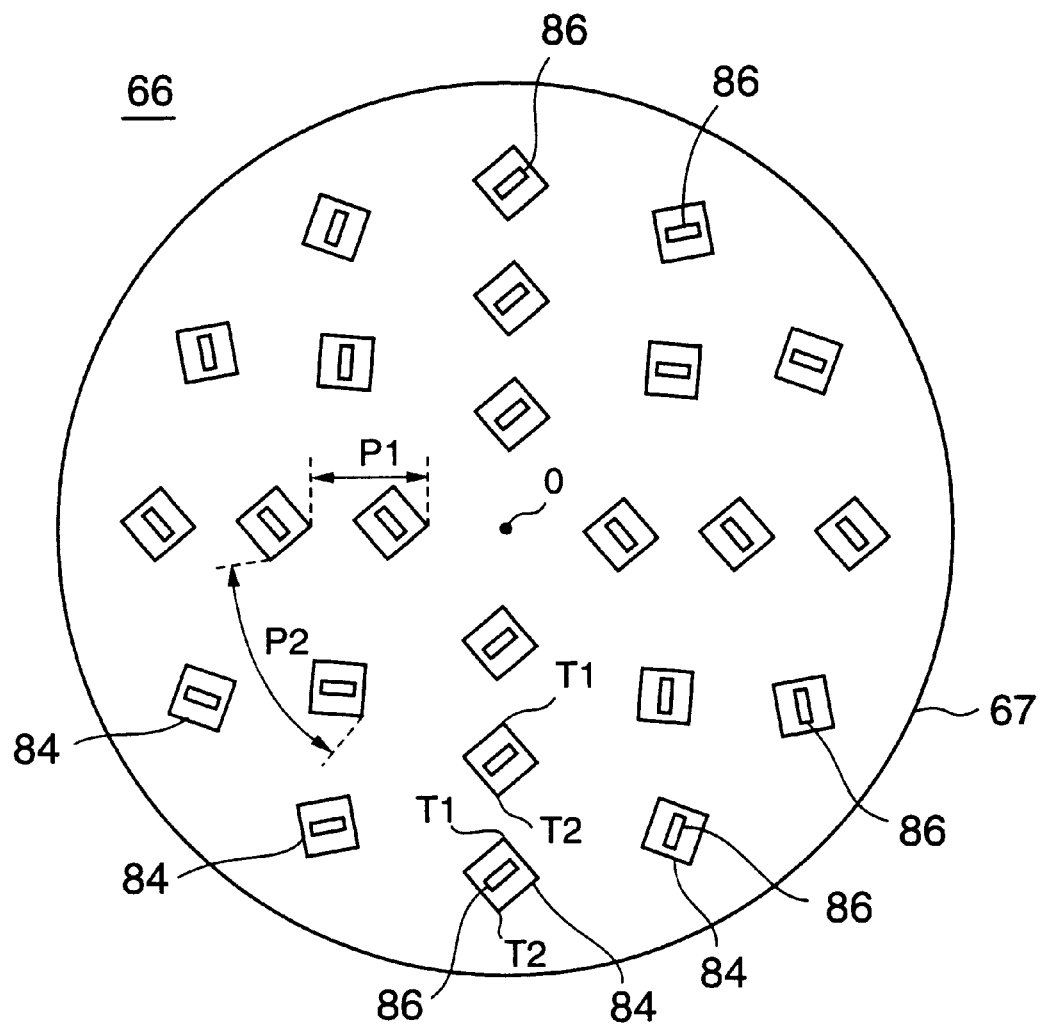
FIG. 5 is a plan view of the flat antenna shown in FIG. 4.
Figure 6:
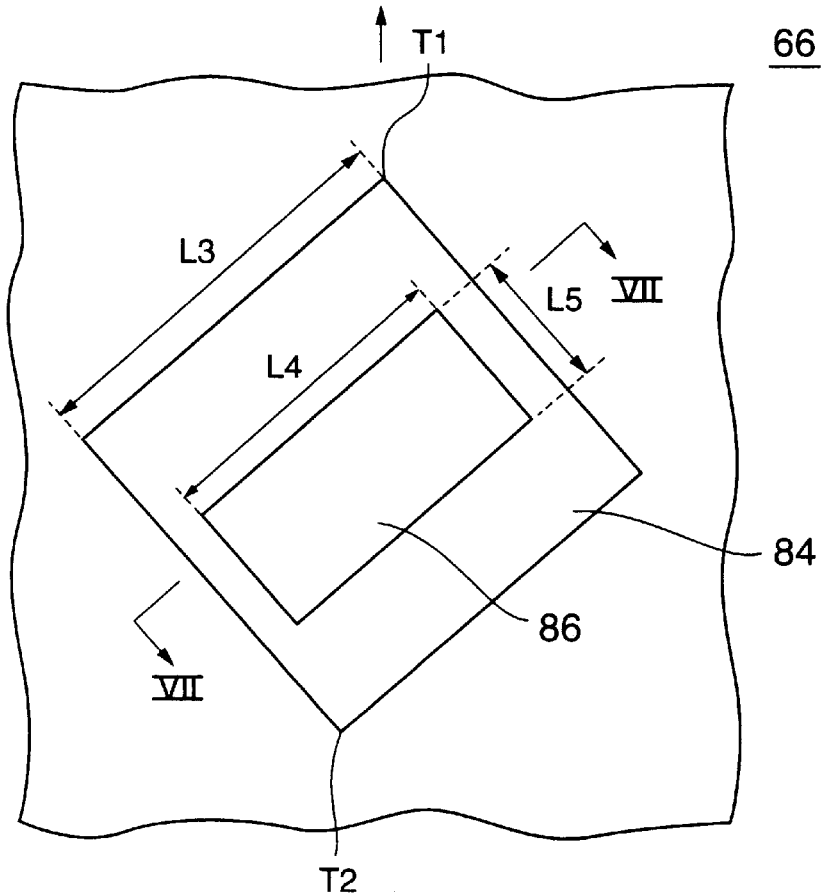
FIG. 6 is an enlarged plan view of a part of the flat antenna shown in FIG. 5.
Figure 7:
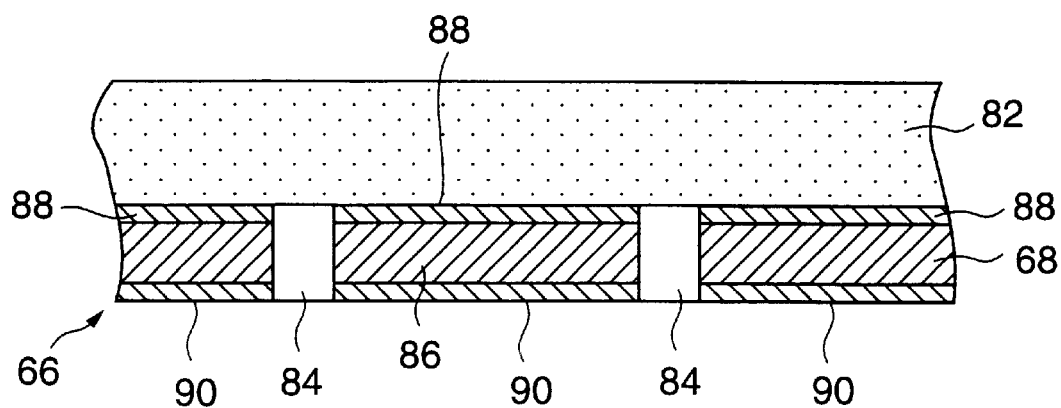
FIG. 7 is an enlarged cross-sectional view of a part of the flat antenna taken along a line VII—VII of FIG. 6.

A detailed description will now be given, with reference to FIGS. 5, 6, and 7 of the flat antenna 66. FIG. 5 is a plan view of the flat antenna 66. FIG. 6 is an enlarged view of a part of the flat antenna 66 in which part of the opening 86 is provided. FIG. 7 is a cross sectional view of the flat antenna 66 taken along a line VII—VII of FIG. 6.

The flat antenna 66 can be a disk-like member having a diameter of 30 cm to 40 cm and a thickness of 1 mm to several millimeters so as to be applicable to an 8-inch wafer. The flat antenna 66 is made of a conductive material such as a silver plated copper plate or an aluminum plate. As shown in FIG. 5, the flat antenna 66 has a plurality of square openings 84, each of which extends between the front and back surfaces of the flat antenna 66. The square openings 84 are uniformly distributed over the entire flat antenna 66. The form of arrangement of the openings 84 is not limited to this specific arrangement, and can also be a concentric circle arrangement, a spiral arrangement or a radial arrangement.

Additionally, the arrangement of the openings 84 is not limited to the uniform distribution as shown in FIG. 5, and the density of the openings 84 may be increased toward a periphery of the flat antenna 66.

Each of the openings 84 is positioned so that the center O of the flat antenna 66 is positioned on an extension of one of the diagonal lines of each of the openings 84. That is, one of the diagonal lines of each of the openings 84 extends in a radial direction of the flat antenna 66. Additionally, the outer periphery of the flat antenna 66 is grounded. Thereby, a current flows through the flat antenna 66 from the center O in radial directions. Thus, a voltage is generated across the vertices T1 and T2 of each of the openings 84, where the vertices T1 and T2 are located on the diagonal line extending in a radial direction and the vertex T1 is closer to the center O than the vertex T2 as shown in FIG. 5.

A circular polarization conductive member 86 is situated inside each of the openings 84 so that a circularly polarized microwave can be generated by each of the openings 84. Specifically, the circular polarization conductive member 86 is formed of the same material forming the flat antenna 66. In the present embodiment, the circular polarization conductive member 86 is made from copper since the flat antenna 66 is made of a copper plate. The circular polarization conductive member 86 is formed in a rectangular parallelepiped so that the surfaces of the circular polarization conductive member 86 are parallel to the inner surfaces of the openings 84. As shown in FIG. 7, in the present invention, both the circular polarization conductive member 86 and the antenna member 66 are bonded to the bottom surface of the slow-wave member 82 by an adhesive 88 such as epoxy resin. Similar to the flat antenna 66, the surface of the circular polarization conductive member 86 is provided with a coating layer 90 such as silver plating so as to facilitate the transmission of the microwave by increasing the electric conductivity with respect to the microwave.

The pitch P1 of the openings 84 in a radial direction and the pitch P2 of the openings 84 in a circumferential direction are not limited to specific lengths. However, in order to generate a uniform plasma, it is preferable that the pitches P1 and P2 be about 0.5 times to 2.5 times the wavelength λ of the microwave supplied to the flat antenna 66. When the slow-wave member 82 is not provided on the flat antenna 66, the wavelength of the microwave supplied to the flat antenna 66 is substantially equal to the wavelength of the microwave in the vacuum. When the slow-wave member 82 is provided, the wavelength of the microwave supplied to the flat antenna 66 is substantially equal to the wavelength of the microwave transmitted in the slow-wave member 82.

In this embodiment, a length of the contour of each of the openings 84 is preferably equal to 0.5 times to 2.5 times the wavelength of the microwave supplied to the flat antenna 66, and is most preferably 1.45 times the wavelength of the microwave supplied to the flat antenna 66 as explained later with reference to FIG. 8. Specifically, 2.45 GHz microwave (wavelength of about 122 mm) is generated by the microwave generator 76. When the slow-wave member 82 is used and the relative permittivity or dielectric constant of the slow-wave member 82 is equal to 9, the wavelength of the microwave supplied to the flat antenna 66 is about 41 mm ($\neq$.122/3). Accordingly, the length of the contour of each of the openings 84 is in the range of 21 mm to 82 mm. For example, when the slow-wave member 82 is provided to the flat antenna 66 and the length of the contour of each of the openings 84 is 1.45 times the wavelength of the microwave supplied to the flat antenna 66, a length L3 of one of the sides of the openings 84 is about 15 mm.

A description will now be given of a plasma processing operation performed by the plasma processing apparatus 20 shown in FIG. 4.

First, the wafer W to be processed is put in the process chamber 22 through the gate valve 58 by using a convey arm (not shown in the figure). The wafer W is placed on the top surface of the table 24 by moving a lifter pin (not shown in the figure) up and down.

Thereafter, air inside the process chamber 22 is evacuated so that a negative pressure ranging from 0.1 mTorr to several tens of mTorr is generated inside the process chamber 22. Argon gas and a process gas such as $SiH_4$, $O_2$ or $N_2$ gas are introduced into the process chamber 22 via the nozzles 38 and 40, respectively, while the negative pressure is maintained inside the process chamber 22. At the same time, the microwave generated by the microwave generator 76 is introduced into the flat antenna 66 via the waveguide 74 and the coaxial waveguide 70 so as to supply to the space S the microwave of which wavelength is shortened by the slow-wave member 82. Thereby, the plasma is generated in the space S so that a predetermined plasma process such as a deposition of a film by a plasma CVD process is performed.

The 2.45 GHz microwave generated by the microwave generator 76 is subjected to a mode change. Then, the microwave propagates through the coaxial waveguide 70 in the TEM mode, and reaches the flat antenna 66 in the waveguide box 68. The microwave is supplied to the center portion of the flat antenna 66, and radially propagates the flat antenna 66. While the microwave radially propagates through the flat antenna 66, the microwave is directed downward toward the space S by the openings 84 uniformly distributed in the flat antenna 66. Thereby, the microwave is introduced into the space S by passing through the insulating plate 62.

The thus-introduced microwave excites the argon gas in the process chamber 22, and, thereby, the argon gas plasma is generated. The plasma diffuses downward, and activates the process gas, which produce active species of the process gas. The active species act on the wafer W so that the plasma CVD process is performed.

As mentioned above, when the microwave radially propagates through the flat antenna 66 from the center portion to the periphery of the flat antenna 66, the microwave is directed downward by each of the openings 84. Since each of the openings 84 is provided with the circular polarization conductive member 86 which is isolated from the inner wall of the square opening 84, the microwave directed toward the process chamber 22 by each of the openings 84 is not a linearly polarized microwave but a circularly polarized microwave. Accordingly, an electric field generated near the periphery of the wafer W placed on the table 24 is prevented from being concentrated. Thereby, an abnormal discharge is prevented from occurring near the periphery of the wafer W. Thus, a uniform plasma can be generated in the space S, which results in improved evenness of the plasma processing with respect to the entire wafer W.

Additionally, since the concentration of an electric field which increases the possibility of generation of an abnormal discharge can be prevented, the microwave can be supplied to the flat antenna 66 at a higher power than the conventional antenna member. Thus, plasma processing time is reduced and throughput can be increased.

Further, since one of the diagonal lines of each of the openings 84 is extended in a radial direction, a voltage is applied across the vertices T1 and T2 of each of the openings 84. Thereby, the circularly polarized microwave can be efficiently generated and directed toward the process chamber 22.

The inventors applied the flat antenna 66 according to this embodiment to an actual plasma processing apparatus, and found that input power can be increased up to 5,000 W without an abnormal discharge, while the plasma processing apparatus provided with the conventional antenna member permits the input power only up to 4,500 W due to generation of an abnormal discharge.

Additionally, since the length of the contour of each of the openings 84 is rendered to be 0.5 times to 2.5 times the wavelength of the microwave supplied to the flat antenna 66, the microwave can be efficiently projected from each of the openings 84 of the flat antenna 66, which results in an improvement of power efficiency.

Figure 8:
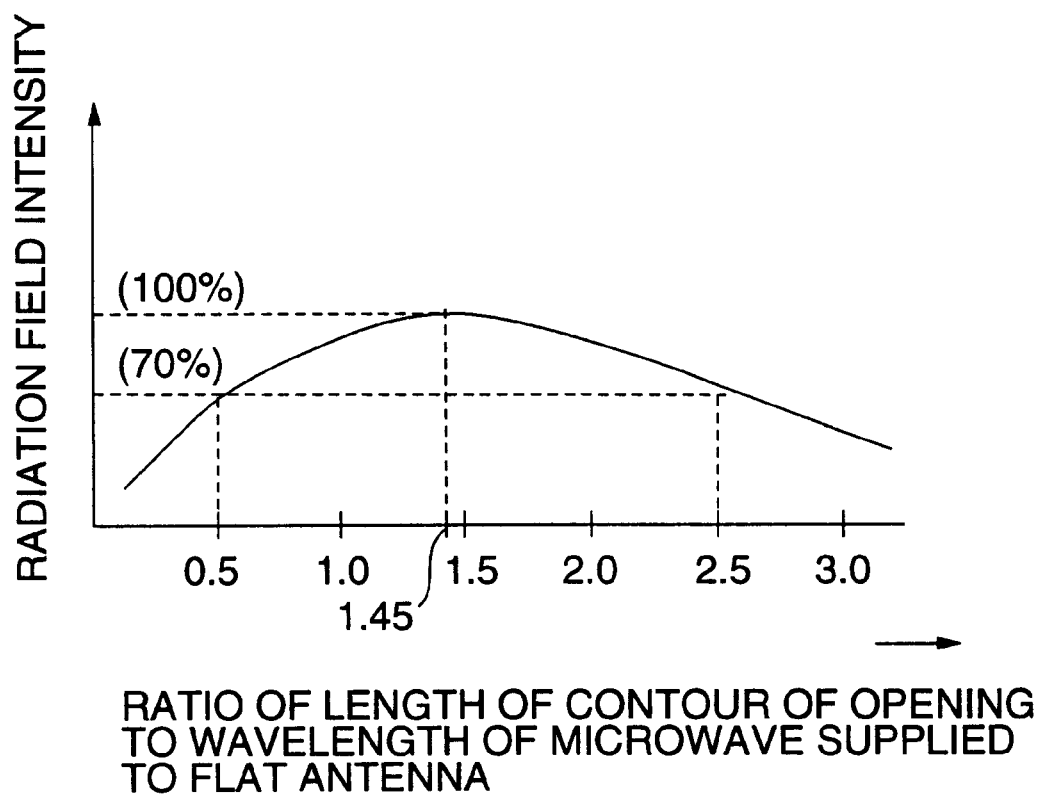
FIG. 8 is a graph showing a relationship between the intensity of radiation of an electric field and the ratio of the length of the contour of the opening to the wavelength of the microwave supplied to the flat antenna.

FIG. 8 is a graph showing a relationship between an intensity of radiation field and a ratio of the length of the contour of each of the openings 84 to the wavelength of the microwave supplied to the flat antenna 66. As shown in FIG. 8, the intensity of radiation field is the maximum when the ratio is equal to 1.45, that is, when the length of the contour of each of the openings 84 is 1.45 times the wavelength of the microwave supplied to the flat antenna 66. Additionally, it can be observed that, in order to obtain more than 70% of the maximum intensity of radiation field, the length of the contour of each of the openings 84 should be 0.5 times to 2.5 times the wavelength of the microwave supplied to the flat antenna 66.

In the present embodiment, the contour of each of the openings 84 is a square shape, that is, the shape of each of the openings 84 in a plan view is a square. However, the contour of each of the openings 84 is not limited to the square shape.

Figure 9A:
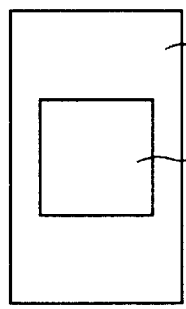
FIGS. 9A through 9H are illustrations of various combinations of the shape of an opening and the shape of circular polarization conductive member.
Figure 9B:
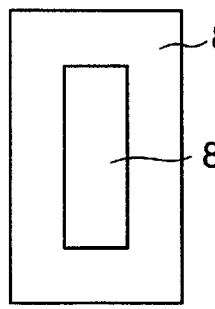
Figure 9C:
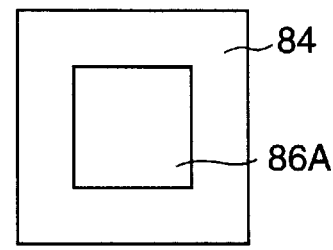
Figure 9D:
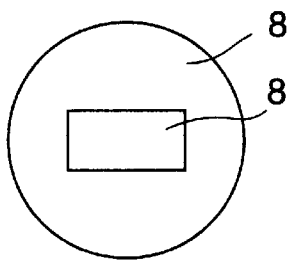
Figure 9E:
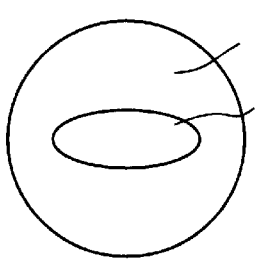
Figure 9F:
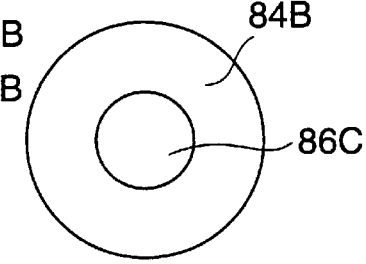
Figure 9G:
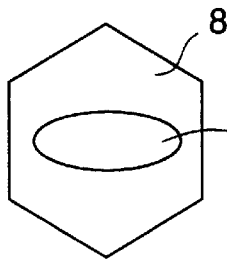
Figure 9H:
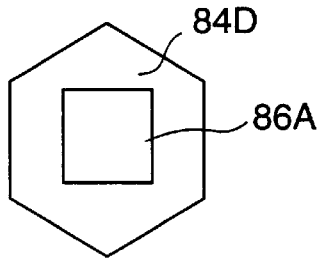

FIGS. 9A through 9H are illustrations of various combinations of the shape of openings 84 and the shape of circular polarization conductive members 86 provided in the flat antenna according to the present embodiment. FIG. 9A shows a combination of a rectangular opening 84A and a circular polarization conductive member 86A having a square shape. FIG. 9B shows a combination of the rectangular opening 84A and the circular polarization conductive member 86 having a rectangular shape. FIG. 9C shows a combination of the square opening 84 and the circular polarization conductive member 86 having a square shape. FIG. 9D shows a combination of a circular opening 84B and the circular polarization conductive member 86 having a rectangular shape. FIG. 9E shows a combination of the circular opening 84B and a circular polarization conductive member 86B having an elliptic shape. FIG. 9F shows a combination of the circular opening 84B and a circular polarization conductive member 86B having a circular shape. FIG. 9G shows a combination of a hexagonal opening 84C and the circular polarization conductive member 86B having an elliptic shape. FIG. 9G shows a combination of the hexagonal opening 84C and the circular polarization conductive member 86A having a square shape.

It should be noted that the length of the contour of each of the openings shown in FIGS. 9A through 9H is set to be 0.5 times to 2.5 times the wavelength of the microwave supplied to the flat antenna 66, and the length of periphery of each of the circular polarization conductive members is set to about one half of the length of the contour of the corresponding opening.

Figure 10:
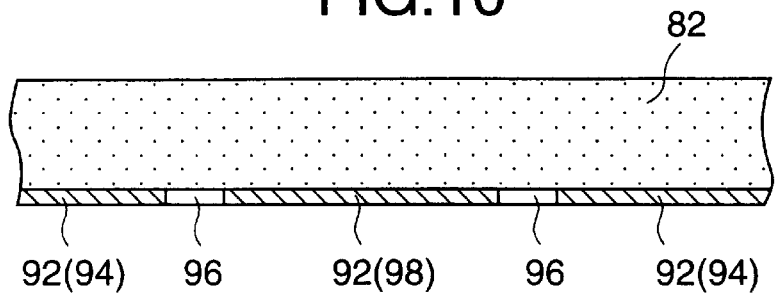
FIG. 10 is a cross-sectional view of a part of the flat antenna formed on a surface of a slow-wave member.

Additionally, although both the flat antenna 66 and the circular polarization conductive member 86 are bonded to the slow-wave member 82 by the adhesive 88 in the above-mentioned embodiment, the present invention is not limited to such a structure. For example, as shown in FIG. 10, both a flat antenna 94 and a circular polarization conductive member 98 can be formed at the same time by etching a copper layer 92 provided on the slow-wave member 82 by means of copper plating. That is, in FIG. 10, portions of the copper layer 92 having a thickness of about 0.02 mm are removed by etching so as to form openings 96 in which the circular polarization conductive member 98 is located. According to this structure of the openings and the circular polarization conductive member, the antenna member can be produced by a simple process.

A description will now be given, with reference to FIGS. 11 through 14, of various arrangements of the openings 84.

Figure 11:
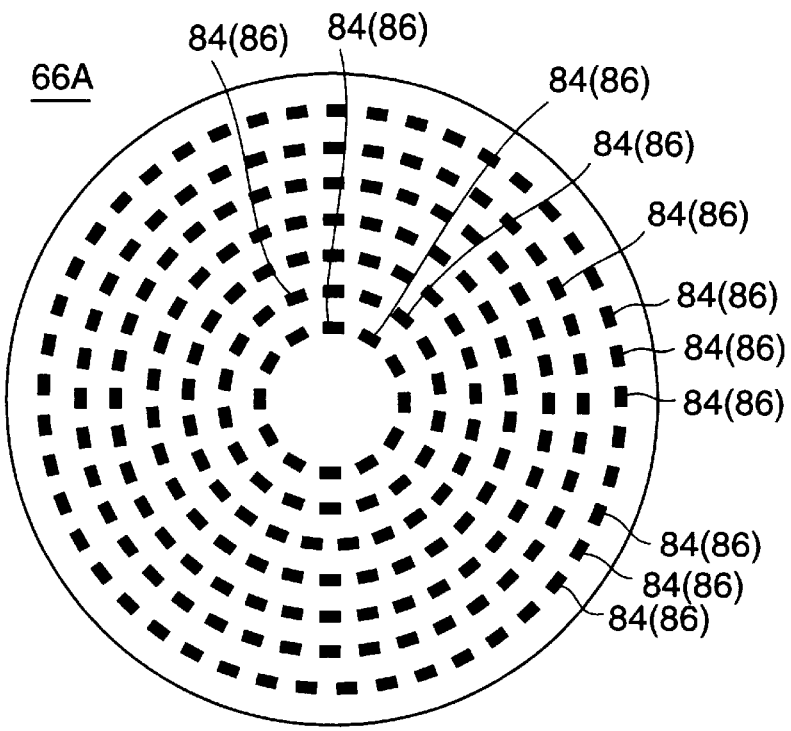
FIG. 11 is a plan view of a flat antenna in which the openings are arranged along concentric circles with a uniform pitch in both a radial direction and a circumferential direction.

FIG. 11 is a plan view of a flat antenna 66A in which the openings 84 are arranged along concentric circles with a uniform pitch in both a radial direction and a circumferential direction. Accordingly, the openings 84 are uniformly distributed over the entire flat antenna 66A.

Figure 12:
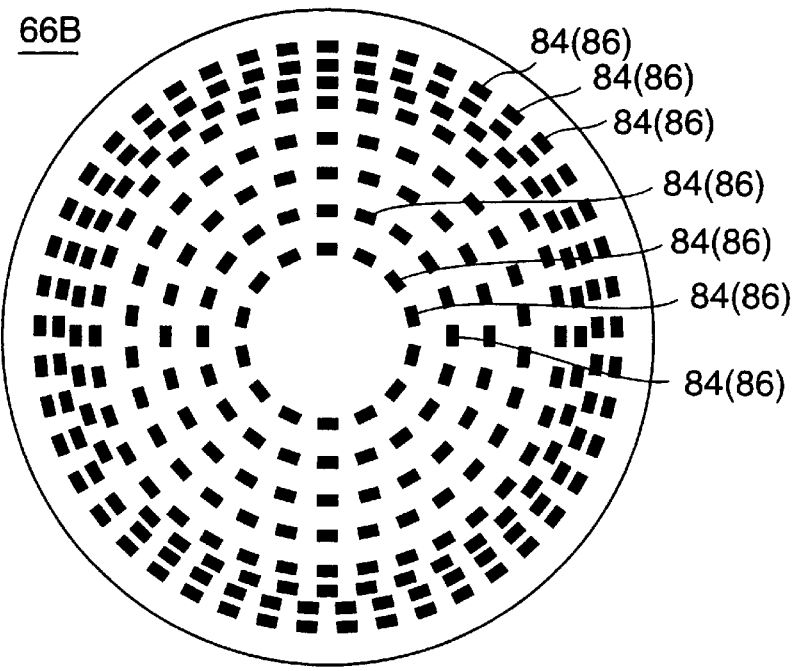
FIG. 12 is a plan view of a flat antenna in which the openings are arranged along concentric circles with different pitches both in a circumferential direction and a radial direction.

FIG. 12 is a plan view of a flat antenna 66B in which the openings 84 are arranged along concentric circles with different pitches in a circumferential direction and different pitches in a radial direction. That is, in the flat antenna 66B, both the pitch of the adjacent ones of the openings along the same circle and the distance between the adjacent ones of the concentric circles are changed at a middle position between the center and the periphery of the flat antenna 66B. That is, the pitch of the openings 84 along the same circle in the outer half portion of the flat antenna 66B is smaller than in the inner half portion of the flat antenna 66B, and the distance between the adjacent ones of the concentric circles in the outer half portion of the flat antenna 66B is smaller than that of the inner half portion of the flat antenna 66B so that the density of the openings 84 in the outer half portion is higher than in the inner half portion.

Figure 13:
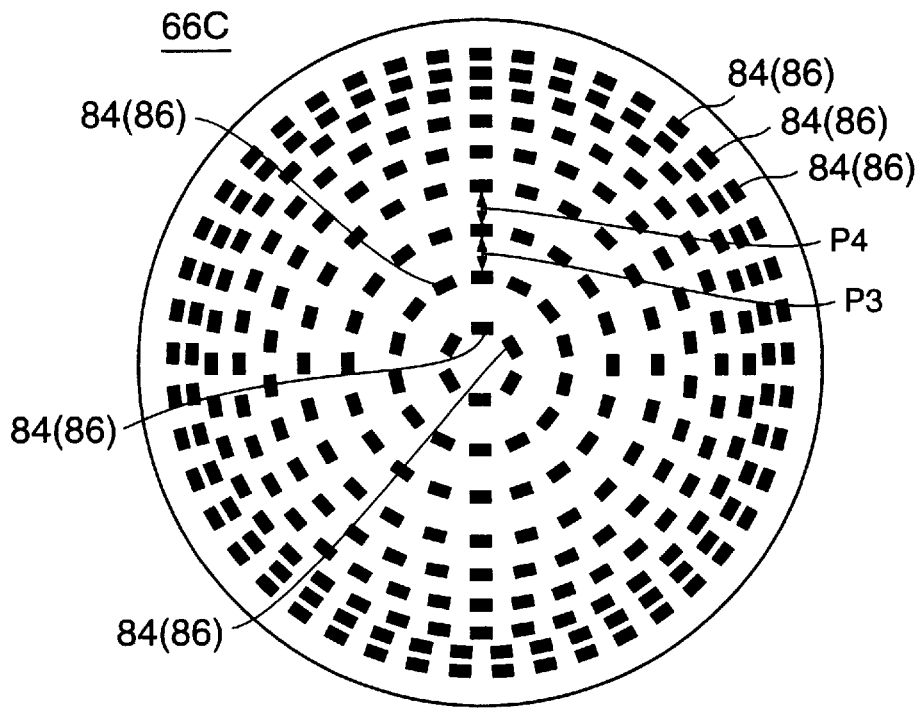
FIG. 13 is a plan view of a flat antenna in which the openings are arranged along concentric circles with the pitch being gradually decreased toward the periphery of the flat antenna.

FIG. 13 is a plan view of a flat antenna 66C in which the openings 84 are arranged along concentric circles with a pitch being gradually decreased toward the periphery of the flat antenna 66C. That is, in the flat antenna 66C, the density of the openings 84 is gradually increased from the center portion to the periphery of the flat antenna 66C. More specifically, in FIG. 13, the distance between adjacent concentric circles is reduced by a reduction ratio of 0.8 to 0.95, for each set of concentric circles moving from the center toward the periphery. That is, in FIG. 13, a pitch P4 and a pitch P3 satisfying a relationship P4=0.8×P3 to 0.95×P3, where P3 is a pitch (distance) between the adjacent concentric circles and P4 is a pitch (distance) between the outer one of the adjacent concentric circles and the concentric circle immediately outside the outer one of the adjacent concentric circles.

According to the arrangements of the openings 84 shown in FIGS. 12 and 13, an intensity of the electric field of the microwave can be increased near the periphery of the flat antenna 66B or 66C. Thereby, the plasma absorbed by the inner wall of the process chamber 22 can be compensated for so as to prevent the density of plasma from being decreased in the vicinity the periphery of the process chamber 22. Thus, plasma having a uniform density over the entire surface of the wafer W can be generated.

Figure 14:
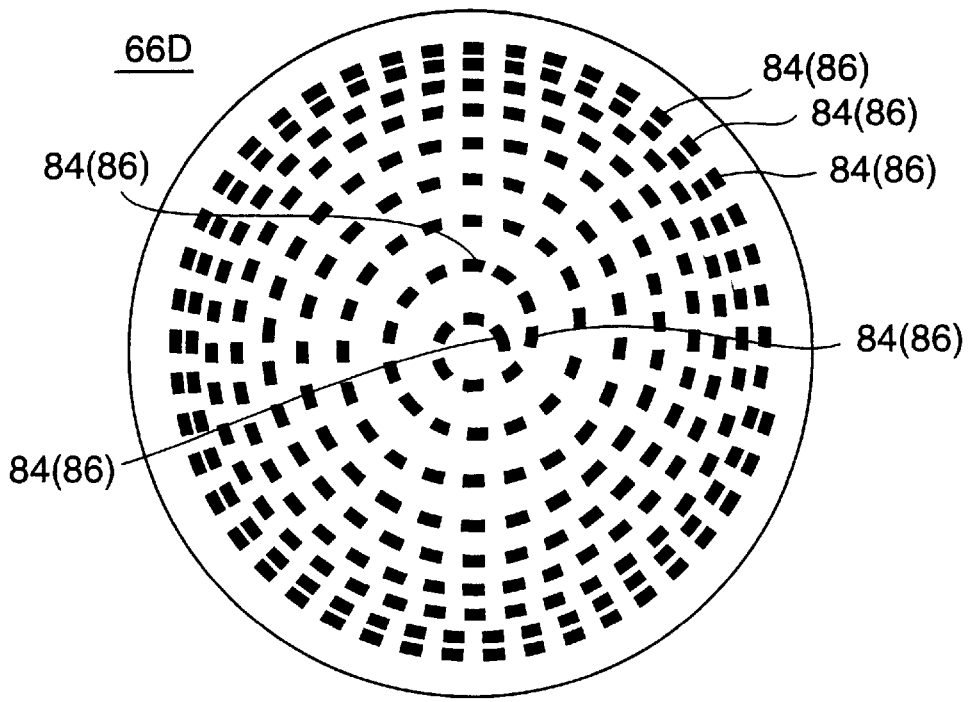
FIG. 14 is a plan view of a flat antenna in which the openings are arranged along a spiral beginning near the center of the flat antenna.

FIG. 14 is a plan view of a flat antenna 66D in which the openings 84 are arranged along a spiral beginning at the center of the flat antenna 66D. The pitch of the openings 84 may be uniform over the entire flat antenna 66D or may be gradually changed toward the periphery of the flat antenna 66D by a reduction ratio of 0.8 to 0.95 similar to that shown in FIG. 13. In this case, the same advantage as the above-mentioned flat antenna 66B or 66C can be obtained.

It should be noted that the openings 84 and the circular polarization conductive member 86 are illustrated in FIGS. 11 to 14 together as rectangles for the sake of simplification, and the reduction ratio of the pitch between the openings 84 in FIGS. 12 through 14 is increased in the illustration so as to emphasize the change in the density of the openings 84.

Figure 15:
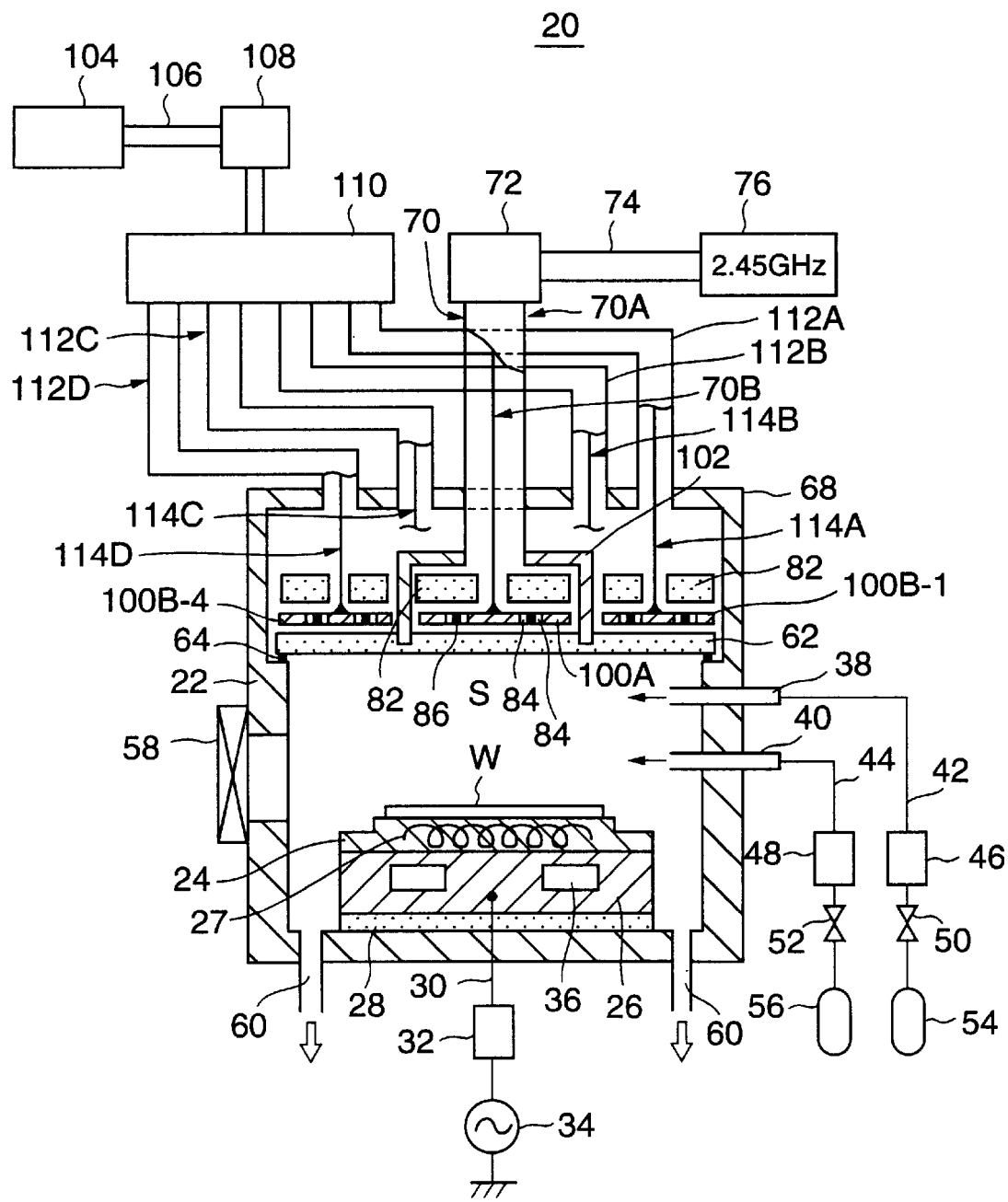
FIG. 15 is a structural diagram of a plasma processing apparatus having a flat antenna according to a second embodiment of the present invention.
Figure 16:
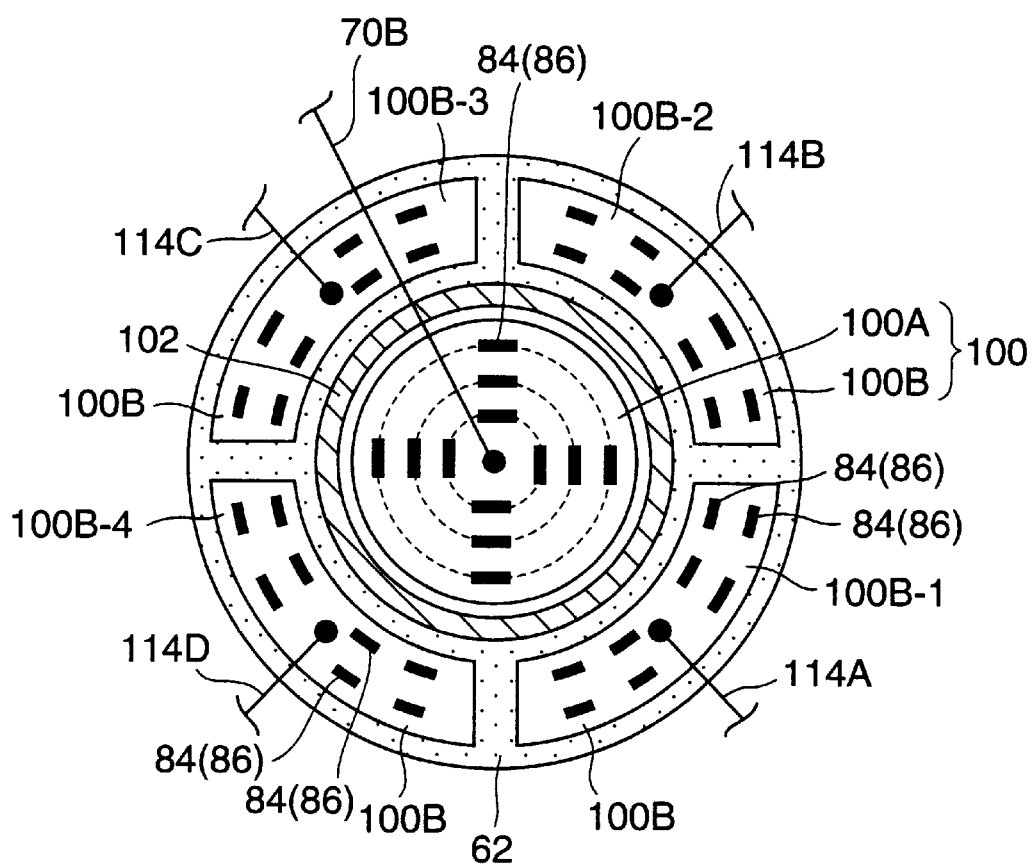
FIG. 16 is a plan view of the flat antenna according to the second embodiment of the present invention.

A description will now be given, with reference to FIGS. 15 and 16, of a second embodiment of the present invention. FIG. 15 is a structural diagram of a plasma processing apparatus having a flat antenna according to the second embodiment of the present invention. FIG. 16 is a plan view of the flat antenna according to the second embodiment of the present invention. In FIGS. 15 and 16, parts that are the same as the parts shown in FIGS. 4 and 5 are given the same reference numerals, and descriptions thereof will be omitted.

As shown in FIGS. 15 and 16, the flat antenna 100 according to the second embodiment of the present invention comprises an inner antenna portion 100A and an outer antenna portion 100B surrounding the inner antenna portion 100A. The inner antenna portion 100A has a diameter equals to about one half of the diameter of the flat antenna 100. The outer antenna portion 100B comprises four antenna portions 100B-1, 100B-2, 100B-3 and 100B-4 that are equally divided in the circumferential direction of the flat antenna 100.

Similar to the plasma processing apparatus shown in FIG. 4, the slow-wave member 82 is provided on the flat antenna 100. The inner antenna portion 100A is accommodated in an inner waveguide box 102, which is made of a conductive material such as copper or aluminum. The outer tube 70A of the waveguide 70, which is connected to a first microwave generator 76, is connected to the upper center portion of the inner waveguide box 102. The inner cable 70B of the waveguide 70 is connected to the center portion of the inner antenna portion 100A. An outer waveguide box 68 accommodates the inner waveguide box 102 and the entire outer antenna portion 100B.

The microwave is supplied to the antenna portions 100B-1 through 100B-4 from a second microwave generator 104. Specifically, the microwave is supplied to each of the antenna portions 100B-1 through 100B-4 of the outer antenna portion 100B via a waveguide 106, a mode converter 108, a distributor 110 and coaxial waveguides 112A, 112B, 112C and 112D. The distributor 110 distributes the microwave to each of the coaxial waveguides 112A, 112B, 112C and 112D that are connected to the antenna portions 100B-1 to 100B-4, respectively. That is, the coaxial waveguides 112A to 112D have inner cable 114A to 114D, respectively, each of which is connected to the center potions of the respective one of the antenna portions 100B-1 through 100B-4 of the outer antenna portion 100B.

The frequencies of the microwaves generated by the first and second microwave generator 76 and 104 are different from each other, and the phases of the microwaves generated by the first and second microwave generators 76 and 104 are slightly shifted from each other so that both microwaves do not have the same phase. For example, if the frequency of the microwave generated by the first microwave generator 76 is 2.45 GHz, the frequency of the microwave generated by the second microwave generator 104 is set to 2.47 GHz. Additionally, the power supplied by the second microwave generator 104 is set to be higher than the power supplied by the first microwave generator 76.

When a plasma is generated in the process chamber 22, a part of the plasma may be absorbed by a side wall of the process chamber 22, or the plasma may be diffused on the periphery thereof. Thus, the density of plasma in the process chamber may be reduced at or near the periphery of the wafer W placed in the process chamber 22. Additionally, when microwave power is supplied by a single microwave generator, a standing wave may be generated in the process chamber 22. For these reasons, there may be a problem in that the conventional single plate antenna cannot provide uniform plasma in the space S of the process chamber 22.

On the other hand, according to the above-mentioned structure of the flat antenna 100 which comprises the inner antenna portion 100A and the antenna portions 100B-1 through 100B-4 of the outer antenna portion 100B, unevenness in the density of the plasma generated in the process chamber 22 can be prevented by separately supplying different microwaves to the antenna portions 100A and 100B-1 through 100B-4. That is, a part of the plasma which is absorbed by the wide wall of the process chamber 22 or diffused near the side wall of the process chamber 22 can be compensated for by setting the power supplied by the second microwave generator 104 to, for example, 3 kW while setting the power supplied by the first microwave generator 76 to 2 kW. Accordingly, the evenness in the density of plasma generated in the space S of the process chamber 22 can be maintained.

Especially, when the structure of the flat antenna according to the first embodiment which can generate the circularly polarized microwave is combined with the structure of the flat antenna according to the second embodiment, the evenness of the plasma generated in the process chamber 22 can be further improved by their synergistic effect.

In the present embodiment, the outer antenna portion 100B is divided into four pieces. However, the number of pieces is not limited to four, and any number can be used. Additionally, the openings provided in the flat antenna according to the present embodiment are not necessarily the openings provided with the circular polarization conductive member as described in the first embodiment, and the openings may be slots similar to those provided in the conventional flat antenna.

It should be noted that although the plasma processing apparatus having one of the flat antennas according to the above-mentioned embodiments performs the plasma CVD process as plasma processing, the plasma processing is not limited to the plasma CVD process. That is, for example, a plasma etching process or a plasma ashing or stripping process may be performed by the plasma processing apparatus having one of the flat antennas according to the present invention.

Additionally, the material to be processed by the plasma processing apparatus is not limited to the wafer for producing a semiconductor device, and the plasma processing apparatus may be used to process an LCD substrate or a glass substrate.

The present invention is not limited to the specifically disclosed embodiments, and variations and modifications may be made without departing from the scope of the present invention.

The present application is based on Japanese priority application No. 11-066477 filed on Mar. 12, 1999, the entire contents of which are hereby incorporated by reference.

What is claimed is:

1. A flat antenna adapted to be used for introducing a microwave into a process chamber so as to generate a plasma within the process chamber, the flat antenna comprising:

a front surface to which the microwave is supplied and a back surface opposite to the front surface, the microwave being supplied to a center portion of the front surface and propagating in radial direction within the flat antenna;

a plurality of openings extending all the way from the front surface to the back surface of the flat antenna; and a conductive member located in each of the openings so that a circularly polarized microwave is radiated by each of the openings.

2. The flat antenna as claimed in claim 1, wherein a length of a contour of each of the openings is set to a length between 0.5 times a wavelength of the microwave and 2.5 times the wavelength of the microwave.

3. The flat antenna as claimed in claim 1, wherein each of the openings has a square shape, and a diagonal line of each of the openings extends in a radial direction of the flat antenna.

4. The flat antenna as claimed in claim 1, wherein the openings are arranged along a plurality of concentric circles.

5. The flat antenna as claimed in claim 4, wherein a density of the openings is increased toward a periphery of the flat antenna.

6. The flat antenna as claimed in claim 1, wherein the openings are arranged along a spiral.

7. The flat antenna as claimed in claim 6, wherein a density of the openings is increased toward a periphery of the flat antenna.

8. The flat antenna as claimed in claim 7, wherein a distance between adjacent openings along the spiral is sequentially reduced to a range between 0.8 and 0.95 of the previous distance.

9. A flat antenna adapted to be used for introducing a microwave into a process chamber so as to generate a plasma within the process chamber, the flat antenna comprising:

a first conductive member having a plurality of openings extending all the way from a front surface to a back surface opposite to the front surface; and a second conductive member situated in each of the openings provided in the first conductive member.

10. A plasma processing apparatus for processing a material to be processed by plasma, the plasma processing apparatus comprising:
a process chamber provided with a table on which the material to be processed is placed;
a microwave generator generating a microwave;
a waveguide transmitting the microwave from the microwave generator; and
a flat antenna connected to the waveguide and positioned outside the process chamber so that the flat antenna is positioned above the table with a top plate of the process chamber therebetween and the flat antenna is positioned parallel to a top surface of the table, the flat antenna comprising;
a front surface to which the microwave is supplied and a back surface opposite to the front surface, the microwave being supplied to a center portion of the front surface and propagating in radial direction within the flat antenna;
a plurality of openings extending all the way from the front surface to the back surface of the flat antenna; and
a conductive member located in each of the openings so that a circularly polarized microwave is radiated by each of the openings.

11. The plasma processing apparatus as claimed in claim 10, further comprising a slow-wave member provided on the front surface of the flat antenna, the slow wave member having a predetermined relative permittivity so as to reduce a wavelength of the microwave transmitted from the flat antenna.

12. The plasma processing apparatus as claimed in claim 10, wherein a length of a contour of each of the openings is set to a length between 0.5 times a wavelength of the microwave and 2.5 times the wavelength of the microwave.

13. The plasma processing apparatus as claimed in claim 10, wherein each of the openings has a square shape, and a diagonal line of each of the opening extends in a radial direction of the flat antenna.

14. The plasma processing apparatus as claimed in claim 10, wherein the openings are arranged along a plurality of concentric circles.

15. The plasma processing apparatus as claimed in claim 14, wherein a density of the openings is increased toward a periphery of the flat antenna.

16. The plasma processing apparatus as claimed in claim 10, wherein the openings are arranged along a spiral.

17. The plasma processing apparatus as claimed in claim 16, wherein a density of the openings is increased toward a periphery of the flat antenna.

18. The plasma processing apparatus as claimed in claim 17, wherein a distance between adjacent openings along the spiral is sequentially reduced between 0.8 and 0.95 of the previous distance.

19. A plasma processing apparatus for processing a material to be processed by plasma, the plasma processing apparatus comprising:
a process chamber provided with a table on which the material to be processed is placed;
a microwave generator for generating a microwave;
a waveguide transmitting the microwave from the microwave generator; and
a flat antenna connected to a the waveguide and positioned outside the process chamber so that the flat antenna is positioned above the table with a top plate of the process chamber therebetween and the flat antenna is positioned parallel to a top surface of the table, the flat antenna comprising:
a first conductive member having a plurality of openings extending all the way from a front surface to a back surface opposite to the front surface;
a second conductive member situated in each of the openings provided in the first conductive member.

* * * * *